(12) United States Patent
Costa et al.

(10) Patent No.: US 11,289,364 B2
(45) Date of Patent: Mar. 29, 2022

(54) RF DEVICES WITH ENHANCED PERFORMANCE AND METHODS OF FORMING THE SAME UTILIZING LOCALIZED SOI FORMATION

(71) Applicant: Qorvo US, Inc., Greensboro, NC (US)

(72) Inventors: Julio C. Costa, Oak Ridge, NC (US); Michael Carroll, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/390,496

(22) Filed: Apr. 22, 2019

(65) Prior Publication Data

US 2019/0326159 A1 Oct. 24, 2019

Related U.S. Application Data

(60) Provisional application No. 62/660,374, filed on Apr. 20, 2018.

(51) Int. Cl.
*H01L 23/66* (2006.01)
*H01L 23/373* (2006.01)
(Continued)

(52) U.S. Cl.
CPC ...... *H01L 21/76245* (2013.01); *H01L 21/565* (2013.01); *H01L 23/29* (2013.01);
(Continued)

(58) Field of Classification Search
CPC .......................... H01L 25/072; H01L 23/3735
See application file for complete search history.

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 1696231 A 11/2005
CN 102956468 A 3/2013
(Continued)

OTHER PUBLICATIONS

U.S. Appl. No. 16/368,210, filed Mar. 28, 2019.
(Continued)

*Primary Examiner* — Omar F Mojaddedi
(74) *Attorney, Agent, or Firm* — Withrow & Terranova, P.L.L.C.

(57) ABSTRACT

The present disclosure relates to a radio frequency (RF) device including a device substrate, a thinned device die with a device region over the device substrate, a first mold compound, and a second mold compound. The device region includes an isolation portion, a back-end-of-line (BEOL) portion, and a front-end-of-line (FEOL) portion with a contact layer and an active section. The contact layer resides over the BEOL portion, the active section resides over the contact layer, and the isolation portion resides over the contact layer to encapsulate the active section. The first mold compound resides over the device substrate, surrounds the thinned device die, and extends vertically beyond the thinned device die to define an opening over the thinned device die and within the first mold compound. The second mold compound fills the opening and directly connects the isolation portion of the thinned device die.

10 Claims, 13 Drawing Sheets

Figure 1:
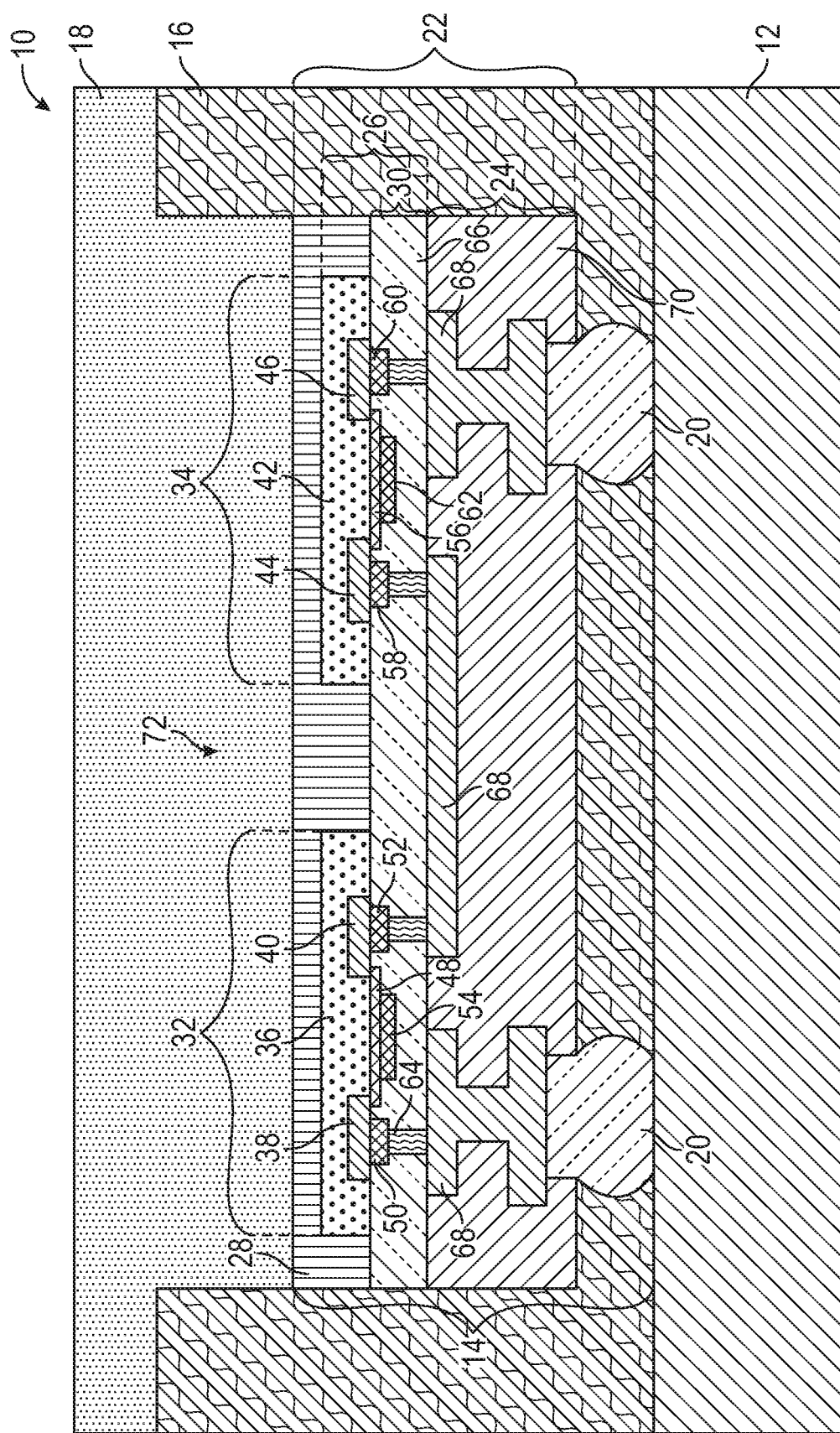

(51) Int. Cl.
*H01L 23/29* (2006.01)
*H01L 23/31* (2006.01)
*H01L 23/28* (2006.01)
*H01L 23/48* (2006.01)
*H01L 21/762* (2006.01)
*H01L 21/56* (2006.01)
*H01L 23/00* (2006.01)

(52) U.S. Cl.
CPC ...... *H01L 23/3121* (2013.01); *H01L 23/3735* (2013.01); *H01L 23/66* (2013.01); *H01L 24/17* (2013.01)

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzergald |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 10,784,348 B2 | 9/2020 | Fanelli et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |

(56) References Cited

U.S. PATENT DOCUMENTS

| | | |
|---|---|---|
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0241040 A1 | 9/2013 | Tojo et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1* | 11/2014 | Jung .................... H01L 23/291 257/774 |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0021754 A1 | 1/2015 | Lin et al. |
| 2015/0097302 A1 | 4/2015 | Wakisaka et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1* | 9/2015 | Costa .................... H01L 23/293 257/506 |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0093580 A1 | 3/2016 | Scanlan et al. |
| 2016/0100489 A1* | 4/2016 | Costa .................. H01L 23/3737 361/764 |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1* | 11/2016 | Costa .................. H01L 23/3135 |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0033026 A1 | 2/2017 | Ho et al. |
| 2017/0053938 A1 | 2/2017 | Whitefield |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0076174 A1 | 3/2018 | Costa et al. |
| 2018/0138082 A1 | 5/2018 | Costa et al. |
| 2018/0138227 A1 | 5/2018 | Shimotsusa et al. |
| 2018/0145678 A1 | 5/2018 | Maxim et al. |
| 2018/0166358 A1 | 6/2018 | Costa et al. |
| 2018/0269188 A1 | 9/2018 | Yu et al. |
| 2019/0013254 A1 | 1/2019 | Costa et al. |
| 2019/0013255 A1 | 1/2019 | Costa et al. |
| 2019/0043812 A1* | 2/2019 | Leobandung ........... H01L 25/50 |
| 2019/0074263 A1 | 3/2019 | Costa et al. |
| 2019/0074271 A1 | 3/2019 | Costa et al. |
| 2019/0172842 A1 | 6/2019 | Whitefield |
| 2019/0189599 A1 | 6/2019 | Baloglu et al. |
| 2019/0287953 A1 | 9/2019 | Moon et al. |
| 2019/0304910 A1 | 10/2019 | Fillion |
| 2019/0312110 A1 | 10/2019 | Costa et al. |
| 2020/0058541 A1 | 2/2020 | Konishi et al. |
| 2021/0348078 A1 | 11/2021 | Haramoto et al. |

FOREIGN PATENT DOCUMENTS

| | | |
|---|---|---|
| CN | 103811474 A | 5/2014 |
| CN | 103872012 A | 6/2014 |
| EP | 2996143 A1 | 3/2016 |

(56) References Cited

FOREIGN PATENT DOCUMENTS

| JP | S505733 Y1 | 2/1975 |
|---|---|---|
| JP | H11-220077 A | 8/1999 |
| JP | 200293957 A | 3/2002 |
| JP | 2002252376 A | 9/2002 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2009200274 A | 9/2009 |
| JP | 2009302526 A | 12/2009 |
| JP | 2011216780 A | 10/2011 |
| JP | 2011243596 A | 12/2011 |
| JP | 2012129419 A | 7/2012 |
| JP | 2012156251 A | 8/2012 |
| JP | 2013162096 A | 8/2013 |
| JP | 2013222745 A | 10/2013 |
| JP | 2013254918 A | 12/2013 |
| JP | 2014509448 A | 4/2014 |
| TW | 201733056 A | 9/2017 |
| WO | 2007074651 A1 | 7/2007 |
| WO | 2018083961 A1 | 5/2018 |
| WO | 2018125242 A1 | 7/2018 |

OTHER PUBLICATIONS

U.S. Appl. No. 16/374,125, filed Apr. 3, 2019.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.

Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Office Action for Japanese Patent Application No. 2018-526613, dated Nov. 5, 2019, 8 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.

(56) References Cited

OTHER PUBLICATIONS

Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Corrected Notice of Allowability for U.S. Appl. No. 15/695,579, dated Feb. 5, 2020, 5 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Final Office Action for U.S. Appl. No. 16/204,214, dated Mar. 6, 2020, 14 pages.
Advisory Action for U.S. Appl. No. 16/204,214, dated Apr. 15, 2020, 3 pages.
Decision of Rejection for Japanese Patent Application No. 2015-180657, dated Mar. 17, 2020, 4 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.

Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.

(56) References Cited

OTHER PUBLICATIONS

Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/992,639, dated May 9, 2019, 7 pages.
Notice of Allowance for U.S. Appl. No. 15/695,579, dated Mar. 20, 2019, 8 pages.
Notice of Allowance for U.S. Appl. No. 16/004,961, dated May 13, 2019, 8 pages.
Non-Final Office Action for U.S. Appl. No. 15/601,858, dated Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, dated May 24, 2019, 11 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.

(56) References Cited

OTHER PUBLICATIONS

Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101. pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application= Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid= 89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Quayle Action for U.S. Appl. No. 16/703,251, dated Jun. 26, 2020, 5 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.

(56) References Cited

OTHER PUBLICATIONS

Notice of Allowability for U.S. Appl. No. 15/695,579, dated Jun. 25, 2020, 4 pages.
Notice of Allowance for U.S. Appl. No. 16/004,961, dated Apr. 30, 2020, 8 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/204,214, dated May 19, 2020, 15 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.
Notice of Allowance for U.S. Appl. No. 16/703,251, dated Aug. 27, 2020, 8 pages.
Notice of Allowance for U.S. Appl. No. 16/454,687, dated Aug. 14, 2020, 7 pages.
Final Office Action for U.S. Appl. No. 16/454,809, dated Aug. 21, 2020, 12 pages.
Advisory Action for U.S. Appl. No. 16/454,809, dated Oct. 23, 2020, 3 pages.
Decision to Grant for Japanese Patent Application No. 2018-526613, dated Aug. 17, 2020, 5 pages.
International Preliminary Report on Patentability for International Patent Application No. PCT/US2019/025591, dated Oct. 15, 2020, 6 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
First Office Action for Chinese Patent Application No. 201680058198.6, dated Dec. 29, 2020, 14 pages.
International Preliminary Report on Patentability for International Patent Application No. PCT/US2019/034645, dated Jan. 14, 2021, 9 pages.
Notice of Allowance for U.S. Appl. No. 16/527,702, dated Nov. 13, 2020, 8 pages.
Notice of Allowance for U.S. Appl. No. 16/374,125, dated Dec. 16, 2020, 9 pages.
Non-Final Office Action for U.S. Appl. No. 16/426,527, dated Nov. 20, 2020, 7 pages.
Final Office Action for U.S. Appl. No. 16/204,214, dated Nov. 30, 2020, 15 pages.
Notice of Allowance for U.S. Appl. No. 16/454,809, dated Nov. 25, 2020, 8 pages.
Non-Final Office Action for U.S. Appl. No. 16/427,019, dated Nov. 19, 2020, 19 pages.
Supplementary Examination Report for Singapore Patent Application No. 11201901194S, dated Mar. 10, 2021, 3 pages.
International Preliminary Report on Patentability for International Patent Application No. PCT/US2019/055317, dated Apr. 22, 2021, 11 pages.
International Preliminary Report on Patentability for International Patent Application No. PCT/US2019/055321, dated Apr. 22, 2021, 14 pages.
Office Action for Taiwanese Patent Application No. 108140788, dated Mar. 25, 2021, 18 pages.
Notice of Allowance for U.S. Appl. No. 16/204,214, dated Feb. 17, 2021, 11 pages.
Non-Final Office Action for U.S. Appl. No. 16/678,551, dated Apr. 7, 2021, 9 pages.
Non-Final Office Action for U.S. Appl. No. 16/678,573, dated Feb. 19, 2021, 11 pages.
Non-Final Office Action for U.S. Appl. No. 16/678,602, dated Feb. 19, 2021, 10 pages.
Applicant-Initiated Interview Summary for U.S. Appl. No. 16/678,573, dated May 7, 2021, 2 pages.
International Preliminary Report on Patentability for International Patent Application No. PCT/US2019/063460, dated Jun. 10, 2021, 9 pages.
Notice of Allowance for U.S. Appl. No. 16/426,527, dated May 14, 2021, 9 pages.
Final Office Action for U.S. Appl. No. 16/427,019, dated May 21, 2021, 16 pages.
Final Office Action and Examiner-Initiated Interview Summary for U.S. Appl. No. 16/678,551, dated Jun. 28, 2021, 9 pages.
Final Office Action and Examiner-Initiated Interview Summary for U.S. Appl. No. 16/678,573, dated Jun. 28, 2021, 10 pages.
Final Office Action for U.S. Appl. No. 16/678,602, dated Jun. 1, 2021, 9 pages.
Notice of Reasons for Refusal for Japanese Patent Application No. 2020119130, dated Jun. 29, 2021, 4 pages.
Notice of Reasons for Rejection for Japanese Patent Application No. 2019507765, dated Jun. 28, 2021, 4 pages.
Search Report for Japanese Patent Application No. 2019507768, dated Jul. 15, 2021, 42 pages.
Notice of Reasons for Refusal for Japanese Patent Application No. 2019507768, dated Jul. 26, 2021, 4 pages.
Reasons for Rejection for Japanese Patent Application No. 2019507767, dated Jun. 25, 2021, 5 pages.
Notice of Allowance for U.S. Appl. No. 16/678,619, dated Jul. 8, 2021, 10 pages.
Corrected Notice of Allowability for U.S. Appl. No. 16/426,527, dated Aug. 18, 2021, 4 pages.
Adivsory Action for U.S. Appl. No. 16/427,019, dated Aug. 2, 2021, 3 pages.
Advisory Action and Examiner-Initiated Interview Summary for U.S. Appl. No. 16/678,551, dated Sep. 13, 2021, 3 pages.
Notice of Allowance and Examiner-Initiated Interview Summary for U.S. Appl. No. 16/678,551, dated Oct. 21, 2021, 8 pages.
Advisory Action and Examiner-Initiated Interview Summary for U.S. Appl. No. 16/678,573, dated Sep. 10, 2021, 3 pages.
Notice of Allowance and Examiner-Initiated Interview Summary for U.S. Appl. No. 16/678,573, dated Oct. 21, 2021, 7 pages.
Non-Final Office Action for U.S. Appl. No. 16/678,586, dated Aug. 12, 2021, 16 pages.
Notice of Allowance and Examiner-Initiated Interview Summary for U.S. Appl. No. 16/678,602, dated Aug. 12, 2021, 11 pages.
Corrected Notice of Allowability for U.S. Appl. No. 16/678,602, dated Aug. 26, 2021, 4 pages.
Decision to Grant for Japanese Patent Application No. 2020119130, dated Sep. 7, 2021, 4 pages.
Second Office Action for Chinese Patent Application No. 201680058198.6, dated Sep. 8, 2021, 8 pages.
Non-Final Office Action for U.S. Appl. No. 16/427,019, dated Dec. 2, 2021, 17 pages.
Corrected Notice of Allowability for U.S. Appl. No. 16/678,551, dated Nov. 24, 2021, 3 pages.
Corrected Notice of Allowability for U.S. Appl. No. 16/678,573, dated Nov. 24, 2021, 3 pages.

(56) References Cited

OTHER PUBLICATIONS

Final Office Action for U.S. Appl. No. 16/678,586, dated Nov. 22, 2021, 15 pages.
Corrected Notice of Allowability for U.S. Appl. No. 16/678,602, dated Nov. 24, 2021, 4 pages.
Corrected Notice of Allowability for U.S. Appl. No. 16/678,602, dated Dec. 30, 2021, 4 pages.
Borel, S. et al., "Control of Selectivity between SiGe and Si in Isotropic Etching Processes," Japanese Journal of Applied Physics, vol. 43, No. 6B, 2004, pp. 3964-3966.
Decision of Rejection for Chinese Patent Application No. 201680058198.6, dated Nov. 12, 2021, 6 pages.
Examination Report for European Patent Application No. 17755402.9, dated Dec. 20, 2021, 12 pages.
Examination Report for European Patent Application No. 17755403.7, dated Dec. 20, 2021, 13 pages.
International Search Report and Written Opinion for International Patent Application No. PCT/US2021/043968, dated Nov. 19, 2021, 15 pages.
Corrected Notice of Allowability for U.S. Appl. No. 16/678,551, dated Jan. 27, 2022, 3 pages.
Corrected Notice of Allowability of U.S. Appl. No. 16/678,573, dated Jan. 27, 2022, 3 pages.
Advisory Action for U.S. Appl. No. 16/678,586, dated Jan. 26, 2002, 3 pages.
Corrected Notice of Allowability for U.S. Appl. No. 16/678,602, dated Feb. 2, 2022, 4 pages.
Decision to Grant for Japanese Patent Application No. 2019507765, dated Feb. 10, 2022, 6 pages.
Decision to Grant for Japanese Patent Application No. 2019507768, dated Feb. 10, 2022, 6 pages.
Notice of Allowance for Japanese Patent Application No. 2019507767, dated Jan. 19, 2022, 6 pages.
Office Letter for Taiwanese Patent Application No. 108140788, dated Jan. 5, 2022, 16 pages.
Non-Final Office Action for U.S. Appl. No. 16/426,527, dated Feb. 16, 2022, 9 pages.
Non-Final Office Action for U.S. Appl. No. 17/102,957, dated Feb. 17, 2022, 9 pages.

\* cited by examiner

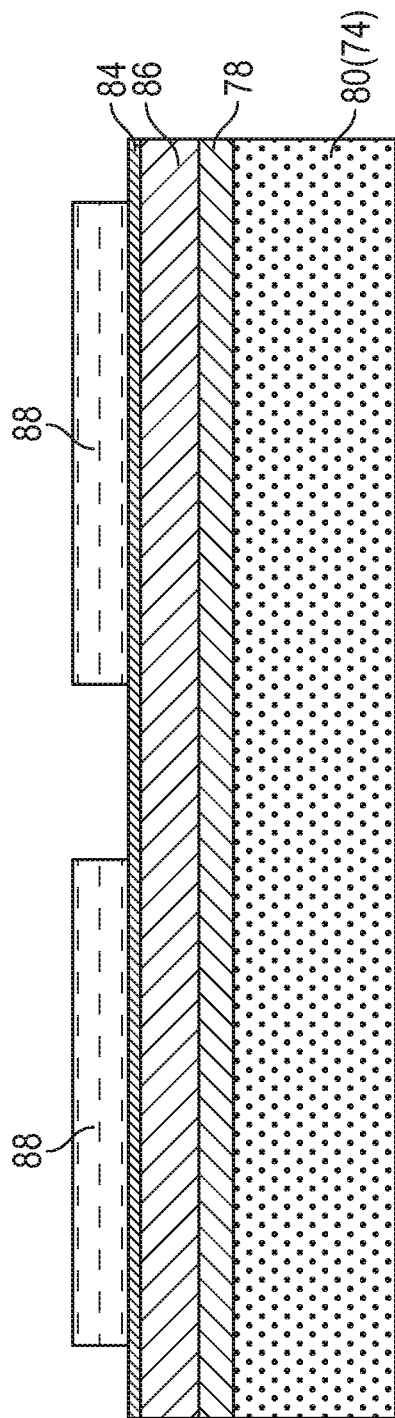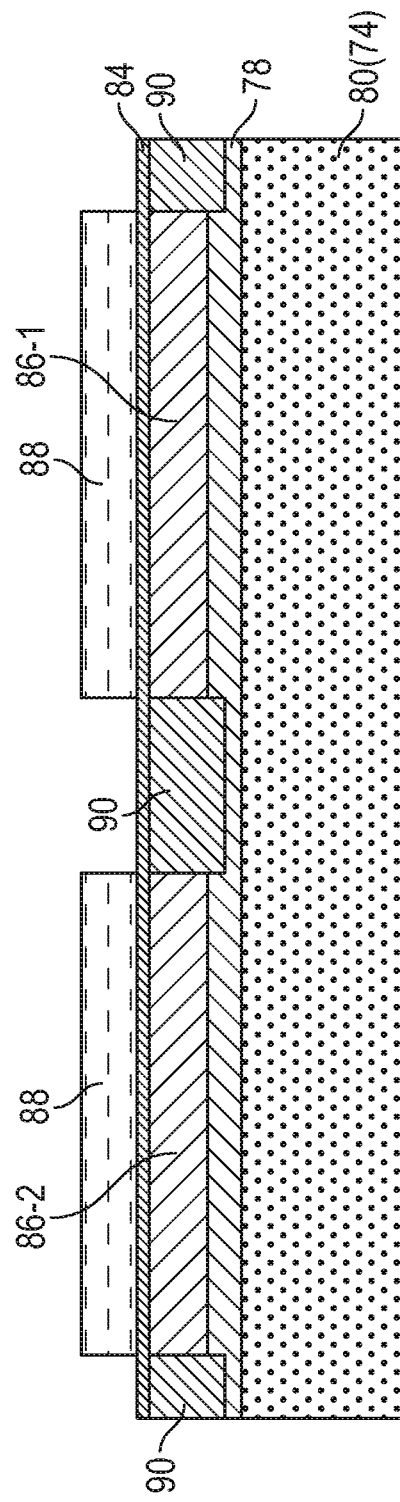

RF DEVICES WITH ENHANCED PERFORMANCE AND METHODS OF FORMING THE SAME UTILIZING LOCALIZED SOI FORMATION

RELATED APPLICATIONS

This application claims the benefit of provisional patent application Ser. No. 62/660,374, filed Apr. 20, 2018, the disclosure of which is hereby incorporated herein by reference in its entirety.

FIELD OF THE DISCLOSURE

The present disclosure relates to a radio frequency (RF) device and a process for making the same, and more particularly to an RF device with enhanced thermal and electrical performance, and a die-level packaging process to provide the RF device with enhanced performance by utilizing localized silicon on insulator (SOI) formation through porous silicon.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon handle substrates may benefit from low cost of silicon materials, a large scale capacity of wafer production, well-established semiconductor design tools, and well-established semiconductor manufacturing techniques.

Despite the benefits of using conventional silicon handle substrates for the RF device fabrications, it is well known in the industry that the conventional silicon handle substrates may have two undesirable properties for the RF devices: harmonic distortion and low resistivity values. The harmonic distortion is a critical impediment to achieving high level linearity in the RF devices built over silicon handle substrates. In addition, high speed and high performance transistors are more densely integrated in RF devices. Consequently, the amount of heat generated by the RF devices will increase significantly due to the large number of transistors integrated in the RF devices, the large amount of power passing through the transistors, and/or the high operation speed of the transistors. Accordingly, it is desirable to package the RF devices in a configuration for better heat dissipation.

To accommodate the increased heat generation of the RF devices and to reduce deleterious harmonic distortion of the RF devices, it is therefore an object of the present disclosure to provide an improved packaging process for enhanced thermal and electrical performance. Further, there is also a need to enhance the performance of the RF devices without increasing the package size.

SUMMARY

The present disclosure relates to a radio frequency (RF) device with enhanced thermal and electrical performance, and a die-level packaging process for making the same. The disclosed RF device includes a device substrate having a top surface, a thinned device die with a device region and a number of bump structures, a first mold compound, and a second mold compound. The device region of the thinned device die includes an isolation portion, a back-end-of-line (BEOL) portion with a number of connecting layers, and a front-end-of-line (FEOL) portion with a contact layer and a first active section. The contact layer of the FEOL portion resides over the BEOL portion, the first active section resides over the contact layer, and the isolation portion resides over the contact layer to encapsulate the first active section. The bump structures are formed at a bottom surface of the BEOL portion and attached to the top surface of the device substrate. Herein, the bump structures are electrically coupled to the FEOL portion via certain ones of the connecting layers. The first mold compound resides over the top surface of the device substrate, surrounds the thinned device die, and extends vertically beyond the thinned device die to define an opening over the thinned device die and within the first mold compound. The isolation portion of the thinned device is at the bottom of the opening. The second mold compound substantially fills the opening and is in contact with the isolation portion.

In one embodiment of the RF device, the first active section is configured to provide an n-type field-effect transistor (NFET), and includes a P-well with an N-source and an N-drain inside. Herein, the P-well is encapsulated by the isolation portion. The contact layer includes a gate structure extending from underneath the N-source to underneath the N-drain, a source contact connected to the N-source, a drain contact connected to the N-drain, and a gate contact connected to the gate structure. At least one of the drain contact and the source contact is coupled to the certain ones of the connecting layers by vias.

In one embodiment of the RF device, the FEOL portion further includes a second active section. Herein, the second active section resides over the contact layer and is encapsulated by the isolation portion. The first active section and the second active section are separated by the isolation portion.

In one embodiment of the RF device, the first active section and the second active section are electrically coupled by one of the connecting layers within the BEOL portion.

In one embodiment of the RF device, the first active section is configured to provide a first NFET, and includes a first P-well with a first N-source and a first N-drain inside, while the second active section is configured to provide a second NFET and includes a second P-well with a second N-source and a second N-drain inside. The first active section and the second active section are encapsulated and separated by the isolation portion. The contact layer includes a first gate structure extending from underneath the first N-source to underneath the first N-drain, a first source contact connected to the first N-source, a first drain contact connected to the first N-drain, a first gate contact connected to the first gate structure, a second gate structure extending from underneath the second N-source to underneath the second N-drain, a second source contact connected to the second N-source, a second drain contact connected to the second N-drain, and a second gate contact connected to the second gate structure. Herein, the first N-source contact is electrically coupled to the second N-drain contact by one of the connecting layers and vias.

In one embodiment of the RF device, the first mold compound and the second mold compound are formed of different materials.

In one embodiment of the RF device, the first mold compound and the second mold compound are formed of a same material.

In one embodiment of the RF device, the second mold compound has a thermal conductivity greater than 1 W/m·K.

In one embodiment of the RF device, the second mold compound has a dielectric constant less than 8.

In one embodiment of the RF device, the first mold compound and the second mold compound have a dielectric constant between 3 and 5.

According to an exemplary process, a precursor package, which includes a device substrate, a first mold compound, a device die with a device region, a silicon handle substrate, and a number of bump structures, is firstly provided. The device region includes an isolation portion, a back-end-of-line (BEOL) portion with a number of connecting layers, and a front-end-of-line (FEOL) portion with a contact layer and a first active section. The contact layer resides over the BEOL portion, the first active section resides over the contact layer, and the isolation portion resides over the contact layer to encapsulate the first active section. The bump structures are formed at a bottom surface of the BEOL portion and attached to a top surface of the device substrate. Herein, the bump structures are electrically coupled to the FEOL portion via certain ones of the connecting layers. The silicon handle substrate resides over the isolation portion of the device region, and the first mold compound resides over the top surface of the device substrate to encapsulate the device die. Next, the first mold compound is thinned down to expose the silicon handle substrate of the device die. The silicon handle substrate is then removed completely to provide a thinned device die, and form an opening within the first mold compound and over the thinned device die. The isolation portion is at the top of the thinned device die and exposed at the bottom of the opening. A second mold compound is applied to substantially fill the opening and reside directly over the isolation portion.

In one embodiment of the exemplary process, the first active section is configured to provide an NFET and includes a P-well with an N-source and an N-drain inside. Herein, the P-well is encapsulated by the isolation portion. The contact layer includes a gate structure extending from underneath the N-source to underneath the N-drain, a source contact connected to the N-source, a drain contact connected to the N-drain, and a gate contact connected to the gate structure. At least one of the drain contact and the source contact is coupled to one of the connecting layers by vias.

In one embodiment of the exemplary process, the FEOL portion further includes a second active section. Herein, the second active section resides over the contact layer and is encapsulated by the isolation portion, and the first active section and the second active section are separated by the isolation portion.

In one embodiment of the exemplary process, the first active section and the second active section are electrically coupled by one of the connecting layers within the BEOL portion.

In one embodiment of the exemplary process, the first active section is configured to provide a first NFET and includes a first P-well with a first N-source and a first N-drain inside, while the second active section is configured to provide a second NFET and includes a second P-well with a second N-source and a second N-drain inside. The first P-well of the first active section and the second P-well of the second active section are encapsulated and separated by the isolation portion. The contact layer includes a first gate structure extending from underneath the first N-source to underneath the first N-drain, a first source contact connected to the first N-source, a first drain contact connected to the first N-drain, a first gate contact connected to the first gate structure, a second gate structure extending from underneath the second N-source to underneath the second N-drain, a second source contact connected to the second N-source, a second drain contact connected to the second N-drain, and a second gate contact connected to the second gate structure. Herein, the first N-source of the first active section is electrically coupled to the second N-drain of the second active section by one of the connecting layers.

In one embodiment of the exemplary process, the second mold compound has a thermal conductivity greater than 1 W/m·K.

In one embodiment of the exemplary process, the second mold compound has a dielectric constant less than 8.

In one embodiment of the exemplary process, the first mold compound and the second mold compound have a dielectric constant between 3 and 5.

In one embodiment of the exemplary process, providing the precursor package starts with providing a SOI starting wafer that includes a P-well, the isolation portion, and the silicon handle substrate. Herein, the isolation portion resides around and underneath the P-well and the silicon handle substrate resides underneath the isolation portion, such that the isolation portion separates the P-well from the silicon handle substrate. The FEOL portion is then formed, where the first active section of the FEOL portion is formed from the P-well and the contact layer is formed over the first active section. The isolation portion resides around and underneath the first active section and separates the first active section from the silicon handle substrate. The BEOL portion is formed over the FEOL portion. Next, the bump structures are formed at the top surface of BEOL portion to complete the device die. The device die is flipped upside down and mounted to the device substrate. As such the bump structures are at the bottom surface of the BEOL portion and attached to the device substrate. The backside of the silicon handle substrate is the tallest component. The first mold compound is then applied over the device substrate to encapsulate the device die.

In one embodiment of the exemplary process, providing the SOI starting wafer starts with providing a p-type silicon wafer. A buried p-type layer within the p-type silicon wafer is then formed by p-type ion implementation. The buried p-type layer divides the silicon wafer into the silicon handle substrate underneath the buried p-type layer and an upper p-type layer over the buried p-type layer. Next, the upper p-type layer is converted into an upper n-type layer by n-type ion implantation. A number of P+ sections are then formed, each of which extends from a top surface of the upper n-type layer into the buried p-type layer under the upper n-type layer, such that an individual upper n-type section is formed in the upper n-type layer and separate from other portions of the upper n-type layer. An electrochemical etching process is performed to convert the buried p-type layer and the P+ sections into a continuous p-type porous silicon (PSi) portion. Herein, the p-type PSi portion resides around and underneath the upper n-type section. At last, the p-type PSi portion is oxidized to provide the isolation portion, and the upper n-type section is converted into the P-well. Herein, the isolation portion resides around and underneath the P-well, and separates the P-well from the silicon handle substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an exemplary radio frequency (RF) device with enhanced thermal and electrical performance according to one embodiment of the present disclosure.

FIGS. 2-18 provide an exemplary die-level packaging process that illustrates steps to fabricate the exemplary RF device shown in FIG. 1.

It will be understood that for clear illustrations, FIGS. 1-18 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "compris-ing," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With the looming shortage of conventional radio frequency silicon on insulator (RFSOI) wafers expected in the coming years, alternative technologies are being devised to get around the need for the RFSOI wafers. One of these alternative technologies is a localized SOI technology by the oxidation of electrochemically etched porous silicon (PSi). However, the localized SOI technology will also suffer from the deleterious distortion effects due to the silicon substrate, similar to what is observed in an RFSOI technology, such that high resistivity substrates and trap-rich layer formation may still be requested. The present disclosure, which relates to an RF device with enhanced thermal and electrical performance, and a die-level packaging process to provide the RF device with enhanced performance by utilizing localized SOI formation through porous silicon, is based on a low-cost low resistivity silicon substrate without a trap-rich layer.

FIG. 1 shows an exemplary RF device 10, which is formed from a low-cost low resistivity silicon handle substrate (not shown herein, processing details are described in following paragraphs), according to one embodiment of the present disclosure. The exemplary RF device 10 includes a device substrate 12, a thinned device die 14, a first mold compound 16, and a second mold compound 18. In detail, the device substrate 12 may be formed from a multi-layer laminate. The thinned device die 14 is attached to a top surface of the device substrate 12, and includes a number of bump structures 20, a device region 22 with a back-end-of-line (BEOL) portion 24, a front-end-of-line (FEOL) portion 26, and an isolation portion 28. For the purpose of this illustration, the FEOL portion 26 includes a contact layer 30, a first active section 32, and a second active section 34. The contact layer 30 resides over the BEOL portion 24 and the first and second active sections 32 and 34 reside over the contact layer 30. The isolation portion 28 resides over the contact layer 30, and the first active section 32 and the second active section 34 are encapsulated and separated by the isolation portion 28. In different applications, the FEOL portion 26 may include fewer or more active sections.

In one embodiment, the first active section 32 is configured to provide a first n-type field-effect transistor (NFET) and includes a first P-well 36 with a first N-source 38 and a first N-drain 40 inside. The second active section 34 is configured to provide a second NFET and includes a second P-well 42 with a second N-source 44 and a second N-drain 46 inside. The isolation portion 28, which may be formed of silicon dioxide, encapsulates the first P-well 36 and the second P-well 42 separately, as to isolate the first active section 32 from the second active section 34. A top surface of the isolation portion 28 is a top surface of the thinned device die 14. In other applications, the first/second active section 32/34 may be configured to provide a P-type FET, a diode, or a resistor.

The contact layer 30 includes a first gate structure 48, a first source contact 50, a first drain contact 52, a first gate contact 54, a second gate structure 56, a second source contact 58, a second drain contact 60, a second gate contact 62, and vias 64 (only one via is labeled with a reference number for clarity), each of which is formed within an insulating material 66. The first gate structure 48 may be formed of silicon oxide, and extends from underneath the first N-source 38 to underneath the first N-drain 40. The first source contact 50, the first drain contact 52, and the first gate contact 54 are directly connected to and under the first N-source 38, the first N-drain 40, and the first gate structure 48, respectively. Similarly, the second gate structure 56 may be formed of silicon oxide, and extends from underneath the second N-source 44 to underneath the second N-drain 46. The second source contact 58, the second drain contact 60, and the second gate contact 62 are directly connected to and under the second N-source 44, the second N-drain 46, and the second gate structure 56, respectively.

The BEOL portion 24 includes multiple connecting layers 68 formed within dielectric layers 70. Each via 64 extends from the first source contact 50, the first drain contact 52, the second source contact 58, or the second drain contact 60 to a corresponding connecting layer 68. In this embodiment, the first N-drain 40 is electrically coupled to the second N-source 44 through the first drain contact 52, vias 64, one of the connecting layers 68, and the second source contact 58, such that the first NFET provided by the first active section 32 and the second NFET provided by the second active section 34 are coupled in series to form a switch. In some applications, the FEOL portion 26 may provide more FETs (between 4 and 40), and the connecting layers 68 in the BEOL portion 24 connect these FETs in series to form a switch with a desired OFF state voltage. In some applications, the first active section 32 and the second active section 34 may not be electrically connected.

The bump structures 20 are formed at a bottom surface of the BEOL portion 24, and attached to the top surface of the device substrate 12. Herein, the bump structures 20 are electrically coupled to at least one of the first active section 32 and the second active section 34 (the first source contact 50 and the second drain contact 60 in this illustration) by certain ones of the connecting layers 68 and certain ones of the vias 64. The bump structures 20 may be solder balls or copper pillars.

The first mold compound 16 resides over the top surface of the device substrate 12, underfills and surrounds the thinned device die 14, and extends above a top surface of the thinned device die 14 to form an opening 72 over the top surface of the thinned device die 14 and within the first mold compound 16. Herein, the top surface of the thinned device die 14 (the top surface of the isolation portion 28) is at the bottom of the opening 72. The first mold compound 16 may be an organic epoxy resin system or the like, which can be used as an etchant barrier to protect the thinned device die 14 against etching chemistries such as potassium hydroxide (KOH), sodium hydroxide (NaOH), and acetylcholine (ACH). In some applications, there may be an underfilling layer (not shown) residing over the top surface of the device substrate 12, such that the underfilling layer encapsulates the bump structures 20 and underfills the thinned device die 14 between the bottom surface of the BEOL portion 24 and the top surface of the device substrate 12. The underfilling layer may be formed of a same or different material as the first mold compound, and is configured to mitigate the stress effects caused by Coefficient of Thermal Expansion (CTE) mismatch between the thinned device die 14 and the device substrate 12. Herein, the first mold compound 16 resides over the underfilling layer and surrounds the thinned device die 14, but does not underfill the thinned device die 14.

The second mold compound 18 substantially fills the opening 72, and is in contact with the top surface of the thinned device die 14 (the top surface of the isolation portion 28). The second mold compound 18 has a thermal conductivity greater than 1 W/m·K or greater than 10 W/m·K, has an electrical resistivity greater than 1E6 Ohm-cm, and has a low dielectric constant less than 8, or between 3 and 5 to yield low RF coupling. The second mold compound 18 may be formed of thermoplastics or thermoset materials, such as PPS (poly phenyl sulfide), overmold epoxies doped with boron nitride, alumina, carbon nanotubes, diamond-like thermal additives, or the like. The second mold compound 18 may be formed of the same or different material as the first mold compound 16. However, unlike the second mold compound 18, the first mold compound 16 does not have thermal conductivity, electrical resistivity, or dielectric constant requirements. Herein, a portion of the second mold compound 18 may reside over the first mold compound 16.

FIGS. 2-18 provide an exemplary die-level packaging process that illustrates steps to provide the exemplary RF device 10 shown in FIG. 1. In addition, FIGS. 2-10 illustrate exemplary steps to provide a SOI starting wafer by utilizing localized SOI formation through porous silicon (PSi). FIGS. 11-18 illustrate exemplary steps to fabricate the exemplary RF device 10 with enhanced performance from the SOI starting wafer shown in FIG. 10. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2-18.

Figure 2:
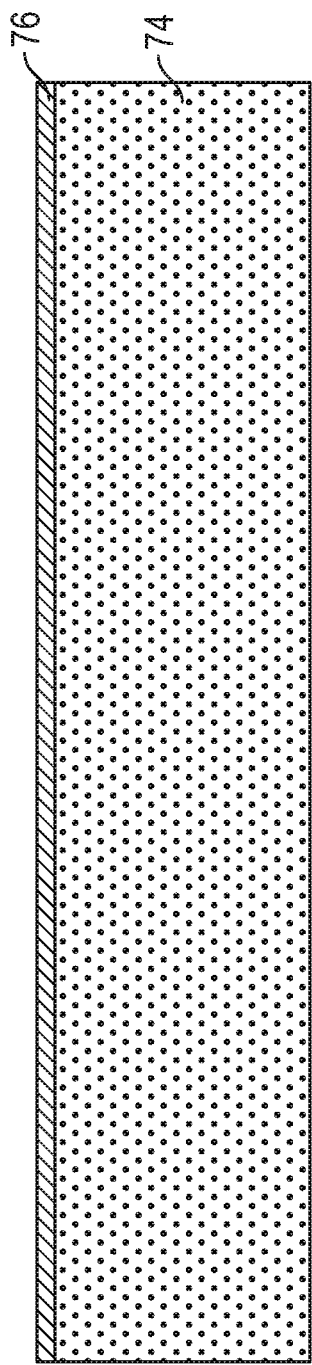
Figure 3:
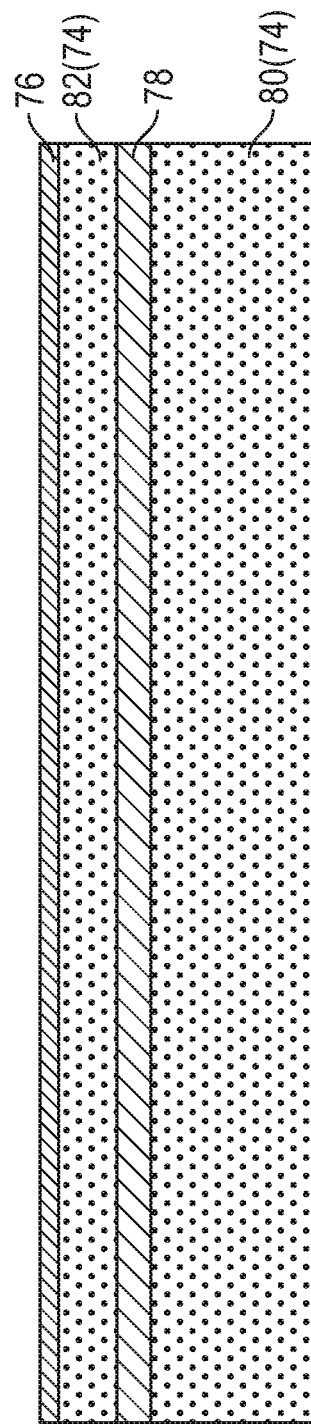

Initially, a silicon wafer 74 with a screen oxide layer 76 on top is provided as illustrated in FIG. 2. The silicon wafer 74 is a p-type wafer and may have a low resistivity between 1 Ohm-cm and 50 Ohm-cm. The screen oxide layer 76 is grown over the silicon wafer 74 and may have a thickness about 50 nm. A low-dose high-energy p-type ion (such as boron) is then implanted into the silicon wafer 74 to form a higher concentration buried p-type layer 78, as illustrated in FIG. 3. The buried p-type layer 78 divides the silicon wafer 74 into two portions, a silicon handle substrate 80 with a thickness between 200 μm and 1500 μm (or between 200 μm and 700 μm) and an upper p-type layer 82 with a thickness between 100 Å and 5000 Å (or between 100 Å and 1000 Å). The buried p-type layer 78 extends horizontally across the whole wafer 74, such that the silicon handle substrate 80 and the upper p-type layer 82 are completely separated by the buried p-type layer 78. The buried p-type layer 78 will be activated at an appropriate high temperature (typically between 600° C. and 1200° C. depending on the conditions of the implant and actual ion species used).

Figure 4:
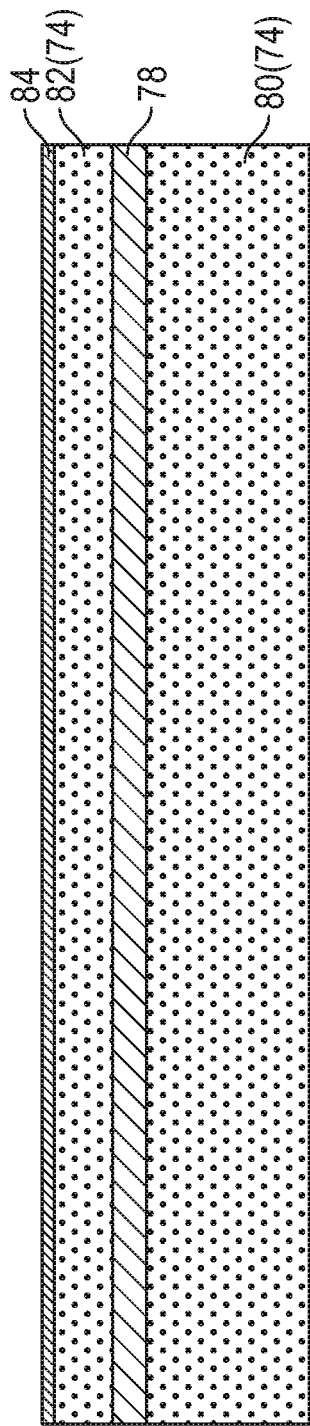
Figure 5:
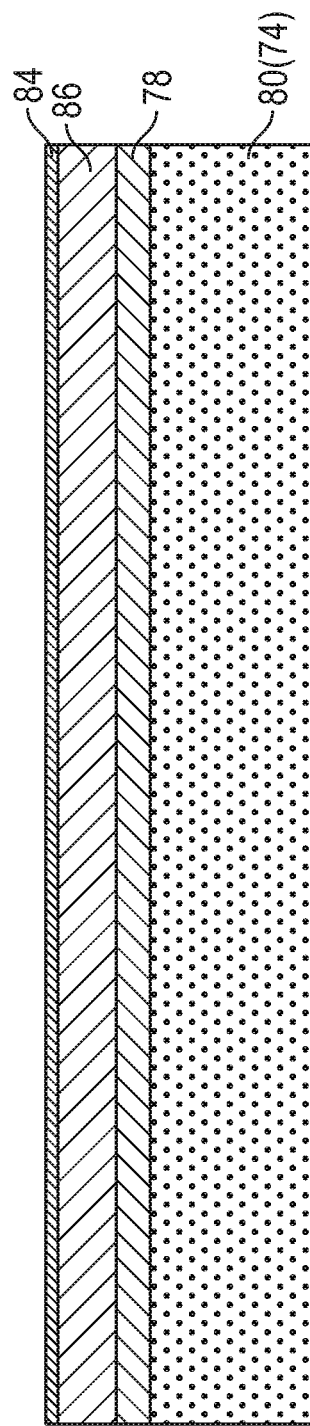

Next, the screen oxide layer 76 is removed and replaced with a silicon nitride layer 84 as illustrated in FIG. 4. The silicon nitride layer 84 may be formed of $Si_3N_4$ by low pressure chemical vapor deposition (LPCVD), and may have a thickness about 150 nm. A high-dose fluorine ion implantation is then performed to convert the upper p-type layer 82 into an upper n-type layer 86 (the thickness does not change), as illustrated in FIG. 5. Because of the buried p-type layer 78, the silicon handle substrate 80 is untouched and remains p-type.

A lithography step is followed as illustrated in FIG. 6. One or more photoresist components 88 are placed over the silicon nitride layer 84 to selectively block the silicon nitride layer 84. A number of P+ sections 90 are then formed underneath exposed regions of the silicon nitride layer 84, as illustrated in FIG. 7. Herein, the P+ sections 90 may be connected to each other and may be formed by a high dose p-type ion (such as boron) implantation into portions of the upper n-type layer 86, which are underneath the exposed regions of the silicon nitride layer 84. The P+ sections 90 will also be activated at an appropriate high temperature (typically between 600° C. and 1200° C. depending on the conditions of the implant and actual ion species used). Each P+ section 90 may extend from a top surface of the upper n-type layer 86 into the buried p-type layer 78. As such, the upper n-type layer 86 is divided into separate sections, a first upper n-type section 86-1 and a second upper n-type section 86-2 in this illustration. In different applications, there may be much more upper n-type section formed from the upper n-type layer 86. In this step, the silicon handle substrate 80 is untouched and remains p-type.

Figure 8:
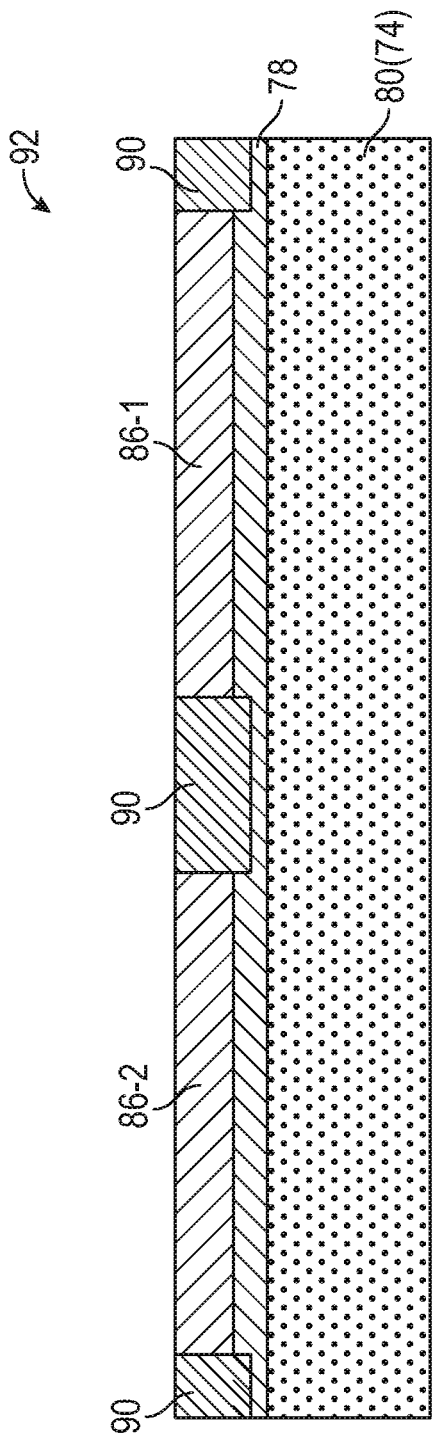
Figure 9:
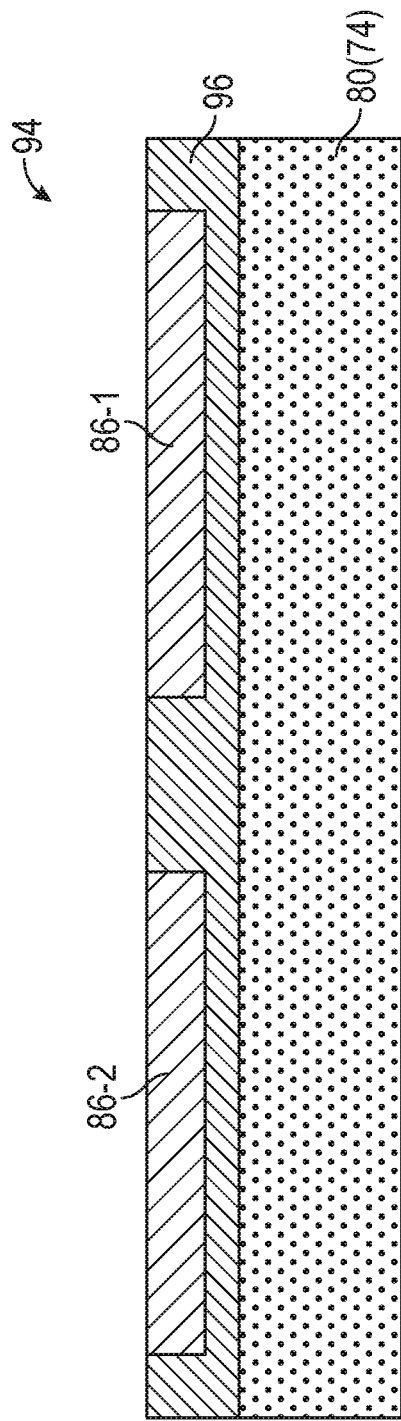

Removal of the one or more photoresist components 88 and the silicon nitride layer 84 is followed to provide a precursor wafer 92, as illustrated in FIG. 8. The silicon nitride layer 84 may be removed by reactive ion etching. When the precursor wafer 92 is annealed in Nitrogen at temperatures between 600° C. and 1200° C., the silicon lattice properties in the first upper n-type section 86-1, the second upper n-type section 86-2, the buried p-type layer 78, and the P+ sections 90 are restored. Herein, the p-type ions (such as boron) in the P+ sections 90 and in the buried p-type layer 78 are substantially fully activated. An electrochemical etching process is then performed to provide a PSi wafer 94, which includes a p-type PSi portion 96 formed from the buried p-type layer 78 and the P+ sections 90, as illustrated in FIG. 9. The first upper n-type section 86-1 and the second upper n-type section 86-2 are untouched and remain separate from each other. The electrochemical etching process requires that a bias voltage is applied across the wafer 92/94 and the wafer 92/94 is immersed in an appropriate wet chemistry. For instance, a bias of 0.4V-1V for a period of several minutes (5 m-15 m) and a chemistry of 4:1 hydrofluoric acid:isopropyl alcohol (HF:IPA) may be used to convert the boron-doped buried p-type layer 78 and the boron-doped P+ sections 90 into the high quality p-type PSi portion 96, while leaving the first upper n-type section 86-1 and the second upper n-type section 86-2 unchanged. A width of the first/second upper n-type section 86-1/86-2 must be carefully selected so as to not have any gaps under the first/second upper n-type section 86-1/86-2, which are not fully converted into PSi. The p-type PSi portion 96 resides around and underneath the first upper n-type section 86-1 and the second upper n-type section 86-2, and also separates the first upper n-type section 86-1 and the second upper n-type section 86-2 from each other.

Figure 10:
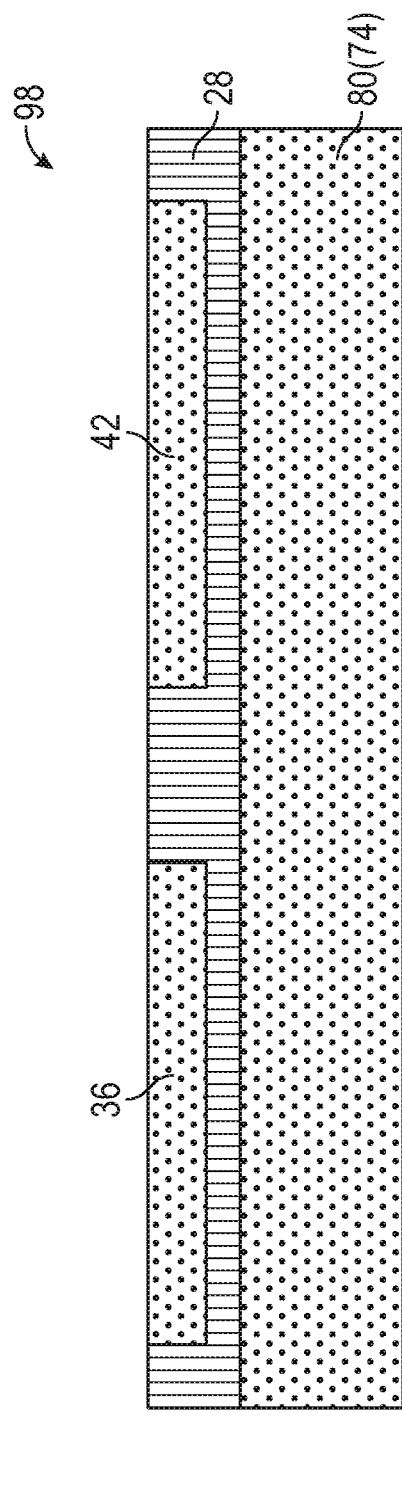

Next, a multistep thermal process is performed to provide a SOI starting wafer 98 from the PSi wafer 94, as illustrated in FIG. 10. In one embodiment, the multistep thermal process starts with placing the PSi wafer 94 in oxygen ($O_2$) at 300° C. for one hour; then the wafer is placed in water steam at 900° C. for fifteen minutes; next, the wafer is placed in $O_2$ at 1000° C. for one hour; and at last, the wafer is placed in nitrogen ($N_2$) at 1100° C. for four hours. This process completely oxidizes the p-type PSi portion 96 to provide the isolation portion 28 that is composed of silicon oxide. Ideally, a porosity factor of 56% void in the silicon is targeted in the p-type PSi portion 96, so as to create an ideal density and no volume expansion for when the p-type PSi portion 96 is converted to silicon oxide. In addition, this process converts the first and second upper n-type sections 86-1 and 86-2 into the first and second P-well 36 and 42 (the thickness does not change), respectively, which are used for device fabrication in the following steps. Consequently, the isolation portion 28 resides around and underneath the first P-well 36 and the second P-well 42, separates the first P-well 36 and the second P-well 42 from each other, and also separates the first P-well 36 and the second P-well 42 from the silicon handle substrate 80. If there are more upper n-type sections in the PSi wafer 94, there will be more P-wells formed in the SOI starting wafer 98 separated by the isolation portion 28. Note that the silicon handle substrate 80 is not oxidized and remains p-type.

Figure 11:
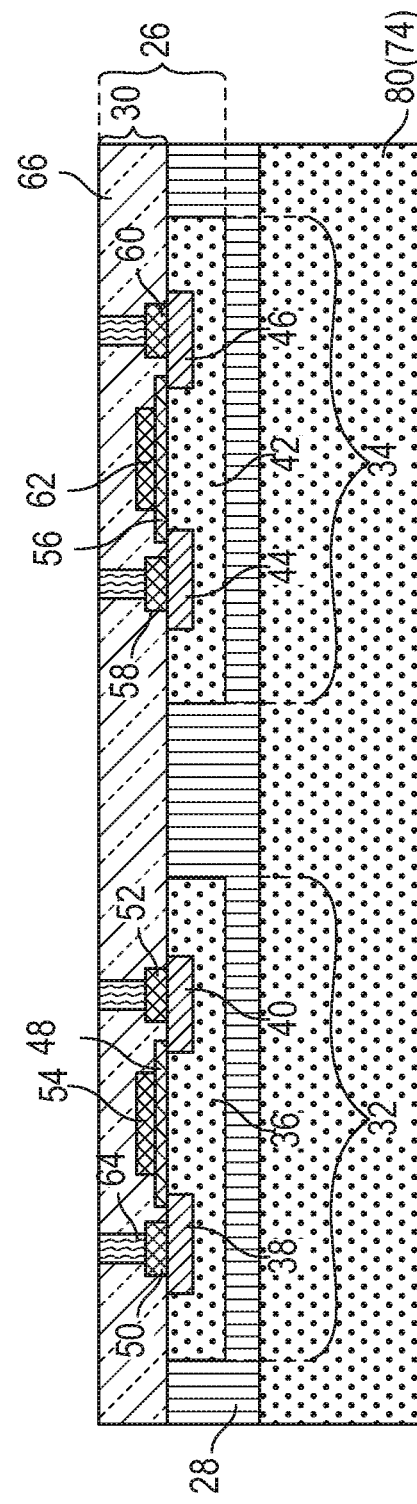

After the SOI starting wafer 98 is prepared, the FEOL portion 26 is formed based on the first P-well 36 and the second P-well 42, as illustrated in FIG. 11. The FEOL portion 26 may be formed by a complementary-metal-oxide-semiconductor (CMOS) process, and includes the first active section 32, the second active section 34, and the contact layer 30. The first active section 32 and the second active section 34 are formed from the first P-well 36 and the second P-well 42, respectively. If the first active section 32 is configured to provide NFET, the first active section 32 may be formed by ion implantation in the first P-well 36 to add the first N-source 38 and the first N-drain 40 within the first P-well 36. Similarly, the second active section 34 may be formed by ion implantation in the second P-well 42 to add the second N-source 44 and the second N-drain 46 within the second P-well 42. The ion implantation may be realized by Halo implant, LDD implant, or other implanting technologies. Herein, the isolation portion 28 resides around and underneath the first active section 32 and the second active section 34, separates the first active section 32 and the second active section 34 from each other, and also separates the first active section 32 and the second active section 34 from the silicon handle substrate 80.

The contact layer 30 resides over the first active section 32, the second active section 34, and the isolation portion 28. The first (second) gate structure 48 (56) extends over from the first (second) N-source 38 (44) to the first (second) N-drain 40 (46). The first (second) source contact 50 (58), the first (second) drain contact 52 (60), and the first (second) gate contact 54 (62) are directly connected to the first (second) N-source 38 (44), the first (second) N-drain 40 (46), and the first (second) gate structure 48 (56), respectively. The first gate structure 48, the first source contact 50, the first drain contact 52, the first gate contact 54, the second gate structure 56, the second source contact 58, the second drain contact 60, and the second gate contact 62 are formed within the insulating material 66. Each via 64 extends from the first source contact 50/ the first drain contact 52/ the second source contact 58/ the second drain contact 60 to a top surface of the contact layer 30.

Figure 12:
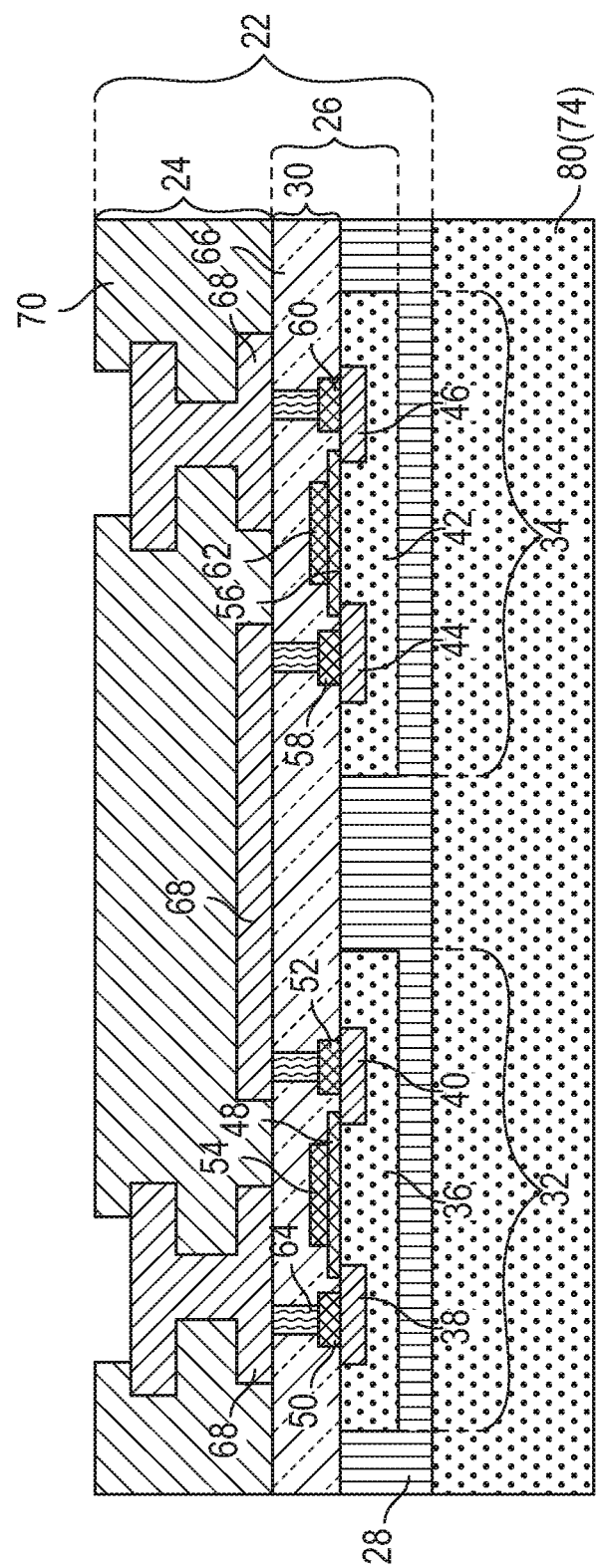

Next, the BEOL portion 24 is formed over the FEOL portion 26 to complete the device region 22, which includes the BEOL portion 24, the FEOL portion 26, and the isolation portion 28, as illustrated in FIG. 12. The BEOL portion 24 includes the connecting layers 68 within the dielectric layers 70. Each via 64 exposed at the top surface of the contact layer 30 is electrically coupled to a corresponding connecting layer 68. When the first active section 32 and the second active section 34 are configured to provide NFETs, the first active section 32 and the second active section 34 may be connected in series by one of the connecting layers 68 to form a CMOS switch. When the first active section 32 and the second active section 34 are configured to provide different types of FETs or other electronic components, the first active section 32 and the second active section 34 may not be electrically connected. Portions of certain ones of the connecting layers 68 are exposed through the dielectric layers 70 at the top surface of the BEOL portion 24. In addition, the BEOL portion 24 may further provide metal-insulator-metal (MIM) capacitors (not shown) by utilizing the connecting layers 68 and the dielectric layers 70.

Figure 13:
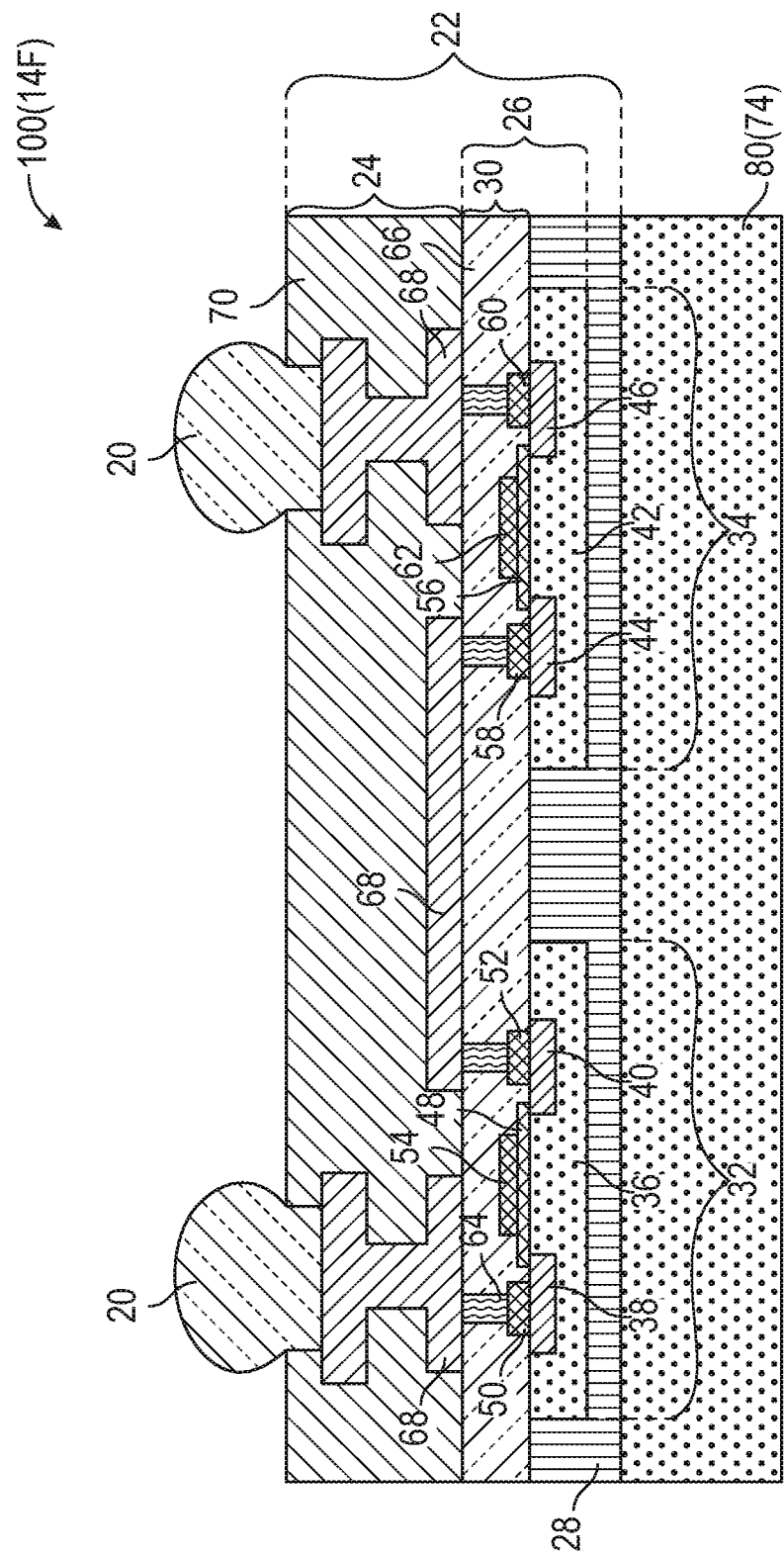

The bump structures 20 are then formed at the top surface of the BEOL portion 24 to provide a device wafer 100, as depicted in FIG. 13. Each bump structure 20 is in contact with the exposed portion of a corresponding connecting layer 68. Herein, each bump structure 20 is electrically coupled to the first active section 32 (the first N-source 38 in this illustration) or the second active section 34 (the second N-drain 46 in this illustration) by certain ones of the connecting layers 68 and a corresponding via 64. The bump structures 20 may be formed by a solder ball bumping technology or a copper pillar packaging technology. Each bump structure 20 protrudes from the top surface of the BEOL portion 24 between 20 µm and 350 µm. The device wafer 100 is then singulated into individual dies (not shown), each of which realizes a circuit function and includes one or more active sections in the FEOL portion 26. Herein, an exemplary singulated device die 14F includes the device region 22 with the first active section 32 and the second active section 34, the bump structures 20 at the top of the device region 22, and the silicon handle substrate 80 underneath the isolation portion 28 of the device region 22.

Figure 14:
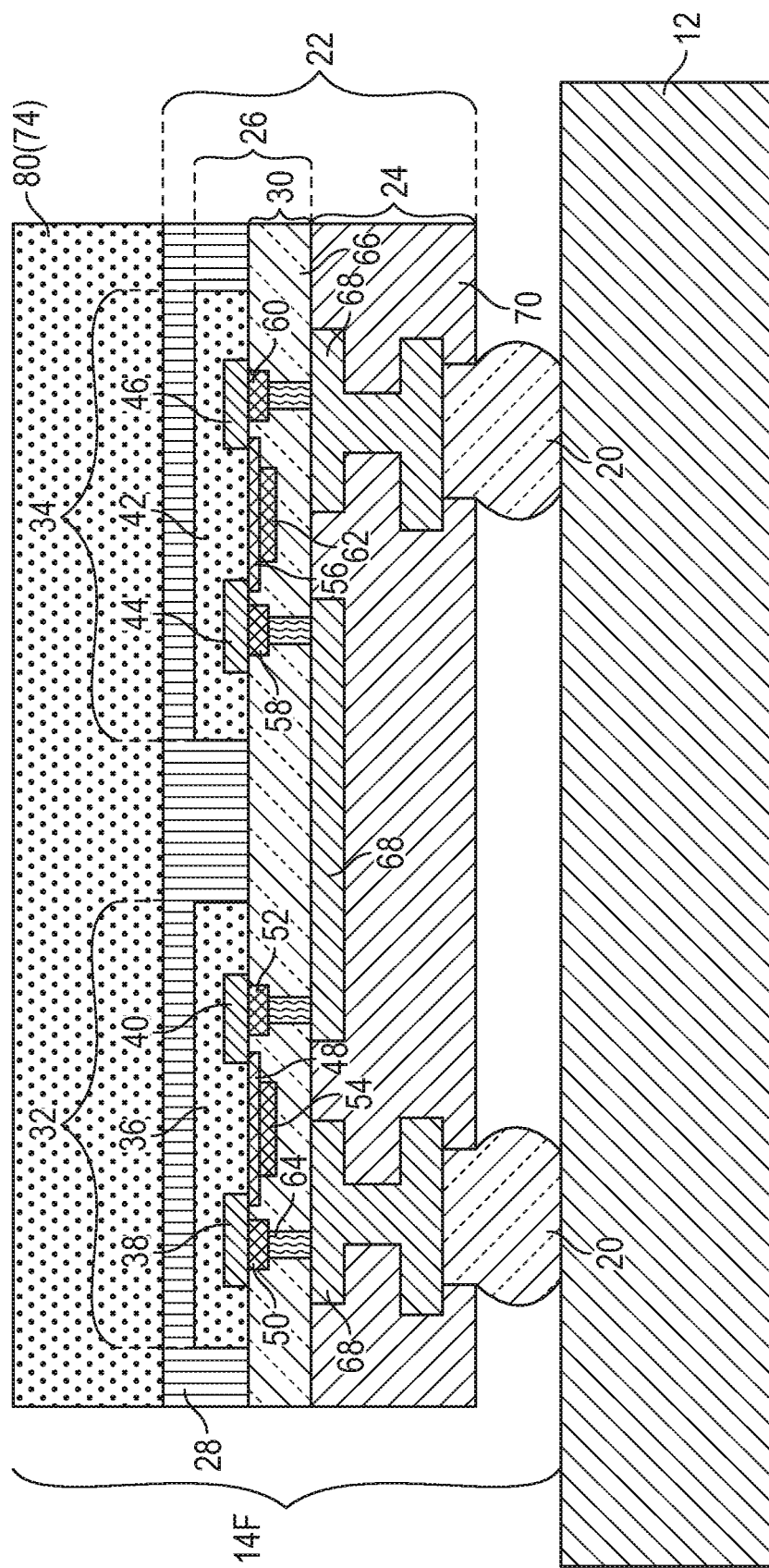
Figure 15:
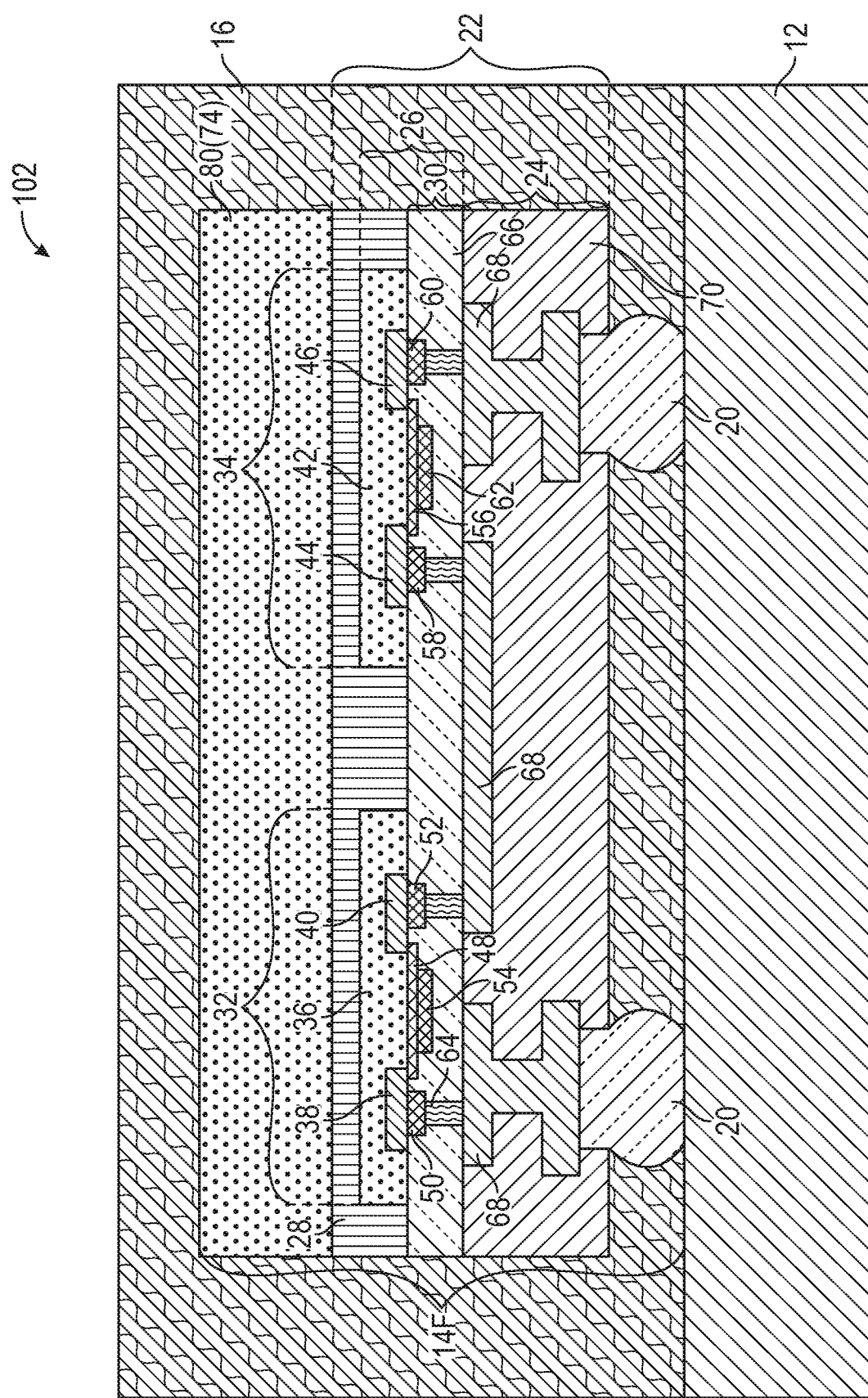

The device die 14F is then flipped upside down and mounted to the device substrate 12 as depicted in FIG. 14. It is clear to those skilled in the art that, a top surface of any layer/portion/region of the device die 14F becomes a bottom surface, while a bottom surface of any layer/portion/region of the device die 14F becomes a top surface. Herein, the bump structures 20 of the device die 14F are attached to the top surface of the device substrate 12, and the backside of the silicon handle substrate 80 is the tallest component after the attaching process. In different applications, there may be multiple device dies mounted to the device substrate 12. Next, the first mold compound 16 is applied over the top surface of the device substrate 12 to provide a precursor package 102 as illustrated in FIG. 15. The device die 14F is fully encapsulated by the first mold compound 16. If there are multiple device dies mounted to the device substrate 12, the first mold compound 16 individually encapsulates each device die, and separates one from each other.

The first mold compound 16 may be applied by various procedures, such as sheet molding, overmolding, compression molding, transfer molding, dam fill encapsulation, and screen print encapsulation. The first mold compound 16 may be formed from an organic epoxy resin system or the like, such as Hitachi Chemical Electronic Materials GE-100LFC, which can be used as an etchant barrier to protect the device die 14F against etching chemistries such as KOH, NaOH, and ACH. A curing process (not shown) is followed to harden the first mold compound 16. The curing temperature may be between 100° C. and 320° C. depending on which material is used as the first mold compound 16.

Notice that, if the RF device 10 includes an underfilling layer, there may be extra steps to form the underfilling layer (not shown) before applying the first mold compound 16 over the top surface of the device substrate 12. Forming the underfilling layer is provided by applying an underfilling material over the top surface of the device substrate 12 and then curing the underfilling material to form the underfilling layer. The underfilling layer encapsulates the bump structures 20 and underfills the device die 14F between the bottom surface of the BEOL portion 24 and the top surface of the device substrate 12. The first mold compound 16 is then applied over the underfilling layer, and encapsulates at least the sides and the top surface of the device die 14F.

Figure 16:
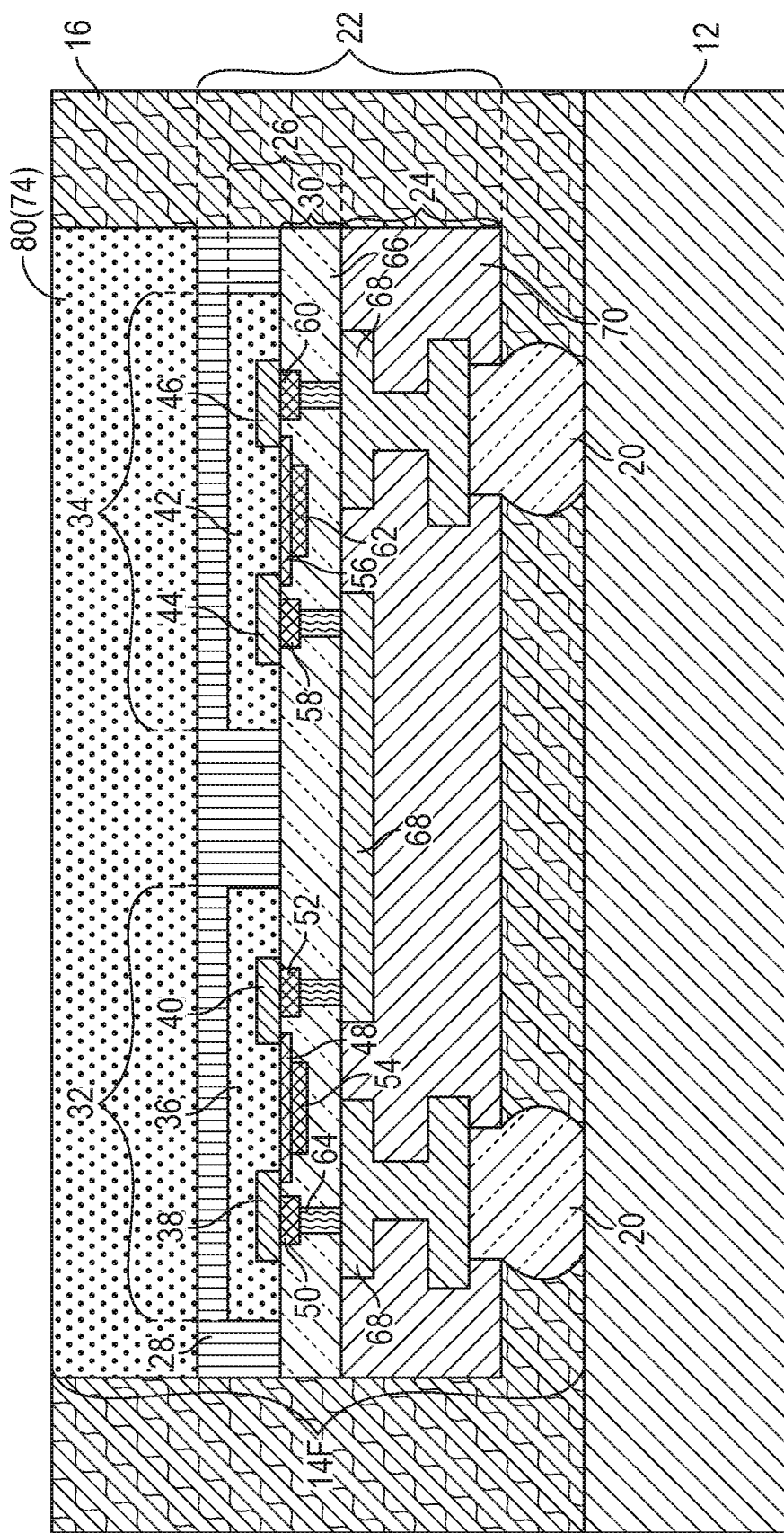
Figure 17:
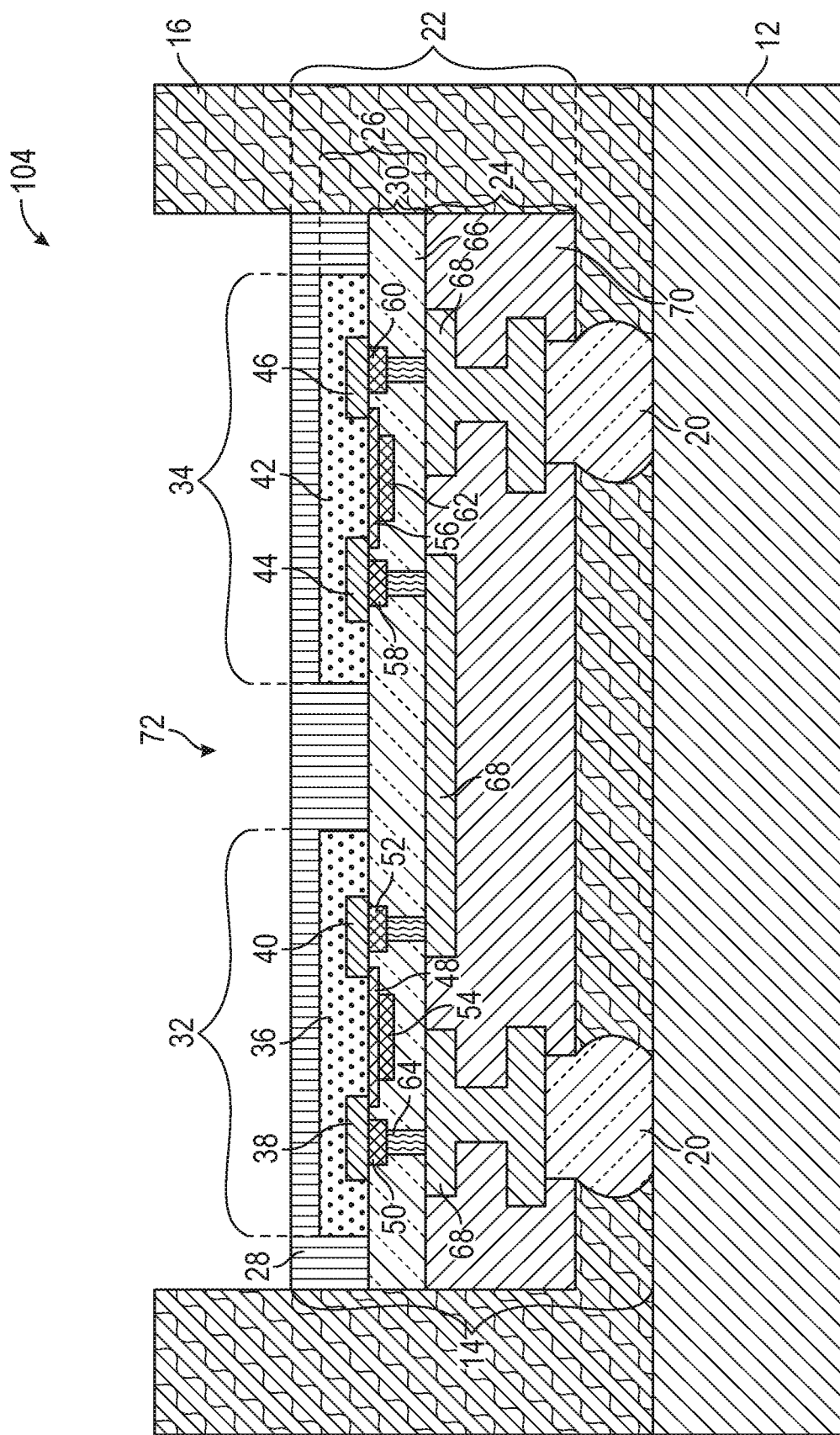

FIG. 16 shows a thinning procedure where the first mold compound 16 is thinned down to expose the backside of the silicon handle substrate 80 of the device die 14F. The thinning procedure may be done with a mechanical grinding process. The silicon handle substrate 80 is then selectively removed to provide an etched package 104, where the selective removal is stopped on the isolation portion 28, as illustrated in FIG. 17. The removal of the silicon handle substrate 80 from the device die 14F provides the thinned device die 14 and forms the opening 72 within the first mold compound 16 and over the thinned device die 14. The top surface of the surface of the thinned device die 14 is the top surface of the isolation portion 28, which is exposed at the bottom of the opening 72. The isolation portion 28 remains encapsulated by the first active section 32 and the second active section 34.

The removal of the silicon handle substrate 80 may be provided by an etching process with a wet/dry etchant chemistry, which may be TMAH, KOH, ACH, NaOH, or the like. The isolation portion 28 functions as an etching stop to protect the first active section 32, the second active section 34, and the contact layer 30 of the thinned device die 14. The first mold compound 16 protects the sides and bottom surface of the thinned device die 14 from the etching process.

Figure 18:
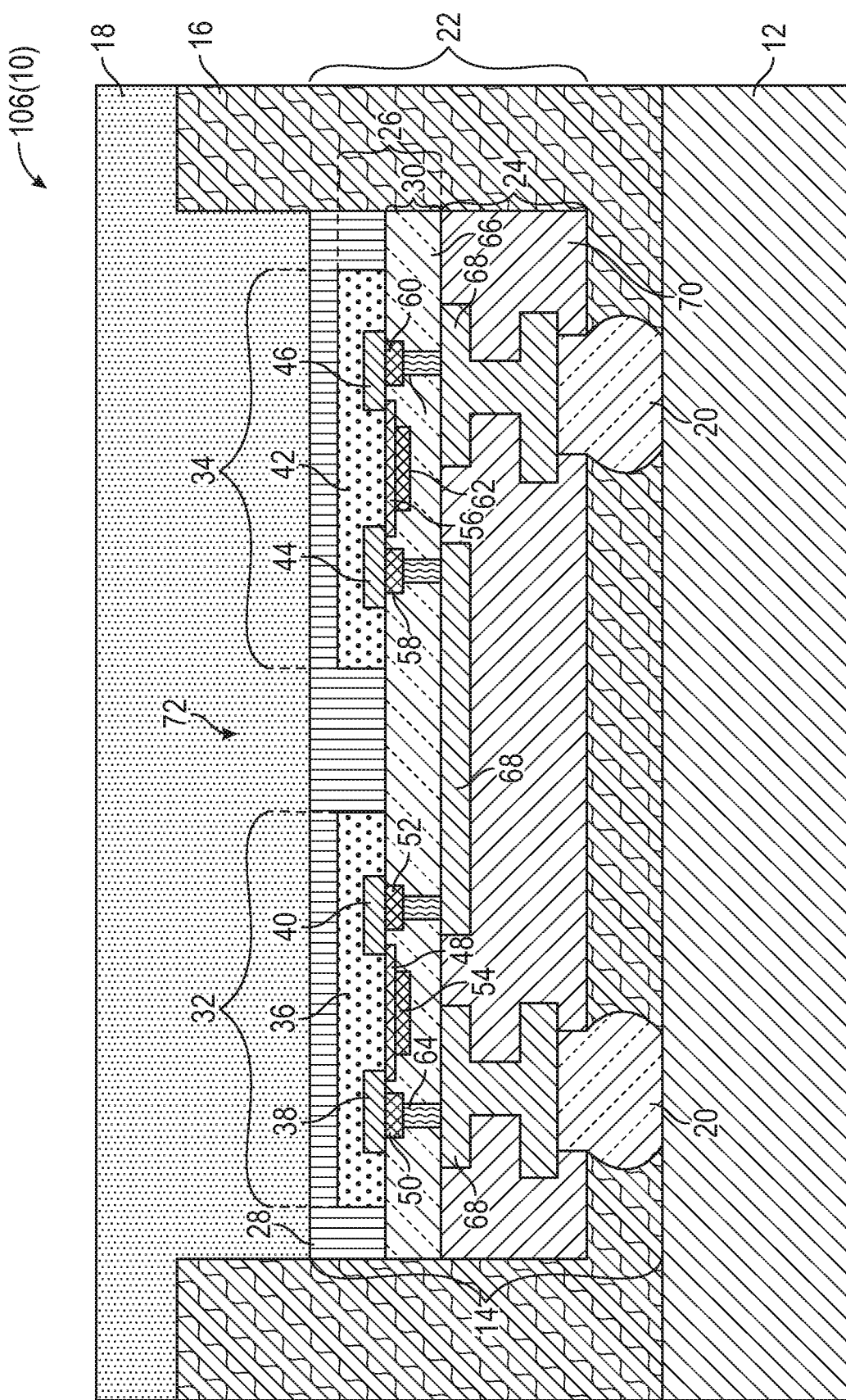

Next, the second mold compound 18 is applied over the etched package 104 to provide a mold device package 106, as illustrated in FIG. 18. The second mold compound 18 substantially fills the opening 72 and is in contact with the top surface of the thinned device die 14. Herein, substantially filling an opening refers to filling at least 75% of the entire opening. There is no silicon handle substrate 80 left in the opening 72, such that there is no silicon handle substrate 80 between the second mold compound 18 and the isolation portion 28. In some applications, portions of the second mold compound 18 may extend over the first mold compound 16.

The second mold compound 18 may have a superior thermal conductivity greater than 1 W/m·K, or greater than 10 W/m·K, and may have a dielectric constant less than 8, or between 3 and 5. The second mold compound 18 may be formed of thermoplastics or thermoset materials, such as PPS (poly phenyl sulfide), overmold epoxies doped with boron nitride, alumina, carbon nanotubes, diamond-like thermal additives, or the like. The second mold compound 18 may be formed of the same or different material as the first mold compound 16. However, unlike the second mold compound 18, the first mold compound 16 does not have thermal conductivity, electrical resistivity, or dielectric constant requirements. The second mold compound 18 may be applied by various procedures, such as compression molding, sheet molding, overmolding, transfer molding, dam fill encapsulation, and screen print encapsulation. A curing process (not shown) is followed to harden the second mold compound 18. The curing temperature is between 100° C. and 320° C. depending on which material is used as the second mold compound 18. After the curing process, the second mold compound 18 may be thinned and/or planarized (not shown).

Lastly, the mold device package 106 may be marked, diced, and singulated into individual devices (not shown).

The RF device 10 is an exemplary singulated device, which achieves switch functionality.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a device substrate having a top surface;
a thinned device die comprising a device region and a plurality of bump structures, wherein:
the device region comprises an isolation portion, a back-end-of-line (BEOL) portion with a plurality of connecting layers, and a front-end-of-line (FEOL) portion with a contact layer and a first active section;
the contact layer resides over the BEOL portion, the first active section resides over the contact layer, and the isolation portion resides over the contact layer and covers sides and a top surface of the first active section, such that a combination of the contact layer and the isolation portion fully encapsulates the first active section; and
the plurality of bump structures are formed at a bottom surface of the BEOL portion and attached to the top surface of the device substrate, wherein the plurality of bump structures are electrically coupled to the FEOL portion via certain ones of the plurality of connecting layers;
a first mold compound residing over the top surface of the device substrate, surrounding the thinned device die, and extending vertically beyond the thinned device die to define an opening over the thinned device die and within the first mold compound, wherein the first mold compound is not formed over the thinned device, and the isolation portion of the thinned device die is at the bottom of the opening; and
a second mold compound substantially filling the opening and in contact with the isolation portion.

2. The apparatus of claim 1 wherein:
the first active section is configured to provide an n-type field-effect transistor (NFET), and includes a P-well with an N-source and an N-drain inside, wherein the P-well is encapsulated by the isolation portion; and
the contact layer includes a gate structure extending from underneath the N-source to underneath the N-drain, a source contact connected to the N-source, a drain contact connected to the N-drain, and a gate contact connected to the gate structure, wherein at least one of the drain contact and the source contact is coupled to the certain ones of the plurality of connecting layers by vias.

3. The apparatus of claim 1 wherein the FEOL portion further comprises a second active section, wherein:
the second active section resides over the contact layer and is encapsulated by the isolation portion; and
the first active section and the second active section are separated by the isolation portion.

4. The apparatus of claim 3 wherein the first active section and the second active section are electrically coupled by one of the plurality of connecting layers within the BEOL portion.

5. The apparatus of claim 4 wherein:
the first active section is configured to provide a first NFET, and includes a first P-well with a first N-source and a first N-drain inside;
the second active section is configured to provide a second NFET and includes a second P-well with a second N-source and a second N-drain inside;
the first active section and the second active section are encapsulated and separated by the isolation portion; and
the contact layer includes a first gate structure extending from underneath the first N-source to underneath the first N-drain, a first source contact connected to the first N-source, a first drain contact connected to the first N-drain, a first gate contact connected to the first gate structure, a second gate structure extending from underneath the second N-source to underneath the second N-drain, a second source contact connected to the second N-source, a second drain contact connected to the second N-drain, and a second gate contact connected to the second gate structure, wherein the first N-source contact is electrically coupled to the second N-drain contact by one of the plurality of connecting layers and vias.

6. The apparatus of claim 1 wherein the first mold compound and the second mold compound are formed of different materials.

7. The apparatus of claim 1 wherein the first mold compound and the second mold compound are formed of a same material.

8. The apparatus of claim 1 wherein the second mold compound has a thermal conductivity greater than 1 W/m·K.

9. The apparatus of claim 1 wherein the second mold compound has a dielectric constant less than 8.

10. The apparatus of claim 9 wherein the first mold compound and the second mold compound have a dielectric constant between 3 and 5.

* * * * *